United States Patent
Moe et al.

(10) Patent No.: US 10,211,368 B2
(45) Date of Patent: *Feb. 19, 2019

(54) ULTRAVIOLET LIGHT-EMITTING DEVICES INCORPORATING GRADED LAYERS AND COMPOSITIONAL OFFSETS

(71) Applicants: Craig Moe, Latham, NY (US); James R. Grandusky, Waterford, NY (US); Shawn R. Gibb, Clifton Park, NY (US); Leo J. Schowalter, Latham, NY (US); Kosuke Sato, Tokyo (JP); Tomohiro Morishita, Tokyo (JP)

(72) Inventors: Craig Moe, Latham, NY (US); James R. Grandusky, Waterford, NY (US); Shawn R. Gibb, Clifton Park, NY (US); Leo J. Schowalter, Latham, NY (US); Kosuke Sato, Tokyo (JP); Tomohiro Morishita, Tokyo (JP)

(73) Assignee: CRYSTAL IS, INC., Green Island, NY (US)

( * ) Notice: Subject to any disclaimer, the term of this patent is extended or adjusted under 35 U.S.C. 154(b) by 92 days.

This patent is subject to a terminal disclaimer.

(21) Appl. No.: 15/587,879

(22) Filed: May 5, 2017

(65) Prior Publication Data

US 2017/0309781 A1 Oct. 26, 2017

Related U.S. Application Data

(63) Continuation of application No. 15/267,470, filed on Sep. 16, 2016, now Pat. No. 9,806,227.

(Continued)

(51) Int. Cl.
*H01L 33/06* (2010.01)
*H01L 33/14* (2010.01)
(Continued)

(52) U.S. Cl.
CPC .......... *H01L 33/06* (2013.01); *H01L 33/0075* (2013.01); *H01L 33/025* (2013.01);
(Continued)

(58) Field of Classification Search
None
See application file for complete search history.

(56) References Cited

U.S. PATENT DOCUMENTS 5,670,798 A * 9/1997 Schetzina ............. H01L 29/205
257/101
6,447,604 B1 9/2002 Flynn et al.
(Continued)

FOREIGN PATENT DOCUMENTS

JP 2011-524632 9/2011
JP 2011-222728 11/2011
(Continued)

OTHER PUBLICATIONS

International Search Report and Written Opinion Issued in a Corresponding International Application No. PCT/US2016/052084, dated Dec. 22, 2016.

*Primary Examiner* — Andres Munoz
(74) *Attorney, Agent, or Firm* — Morgan, Lewis & Bockius, LLP

(57) ABSTRACT

In various embodiments, light-emitting devices incorporate graded layers with compositional offsets at one or both end points of the graded layer to promote formation of two-dimensional carrier gases and polarization doping, thereby enhancing device performance.

39 Claims, 8 Drawing Sheets

Related U.S. Application Data

(60) Provisional application No. 62/219,881, filed on Sep. 17, 2015, provisional application No. 62/237,027, filed on Oct. 5, 2015.

(51) Int. Cl.

| | | |
|---|---|---|
| *H01L 33/32* | (2010.01) | |
| *H01L 33/46* | (2010.01) | |
| *H01L 33/00* | (2010.01) | |
| *H01L 33/02* | (2010.01) | |
| *H01L 33/36* | (2010.01) | |
| *H01L 33/40* | (2010.01) | |

(52) U.S. Cl.
CPC ............ *H01L 33/145* (2013.01); *H01L 33/32* (2013.01); *H01L 33/36* (2013.01); *H01L 33/46* (2013.01); *H01L 33/405* (2013.01)

(56) References Cited

U.S. PATENT DOCUMENTS

| | | | |
|---|---|---|---|
| 6,618,413 | B2 | 9/2003 | Bour et al. |
| 7,271,416 | B2 | 9/2007 | Saxler et al. |
| 7,629,619 | B2 * | 12/2009 | Taki ................... B82Y 20/00 |
| | | | 257/103 |
| 8,012,257 | B2 | 9/2011 | Morgan et al. |
| 8,044,384 | B2 | 10/2011 | Bergmann et al. |
| 8,080,833 | B2 | 12/2011 | Grandusky et al. |
| 8,222,650 | B2 | 7/2012 | Schowalter et al. |
| 8,507,929 | B2 | 8/2013 | Grillot et al. |
| 8,962,359 | B2 | 2/2015 | Schowalter et al. |
| 9,012,884 | B2 * | 4/2015 | Kim ..................... H01L 33/14 |
| | | | 257/13 |
| 9,269,852 | B2 | 2/2016 | Li et al. |
| 9,299,880 | B2 * | 3/2016 | Grandusky ............ H01L 33/22 |
| 9,331,246 | B2 | 5/2016 | Kneissl et al. |
| 9,337,391 | B2 | 5/2016 | Jean et al. |
| 9,418,194 | B2 | 8/2016 | Liu et al. |
| 9,437,430 | B2 | 9/2016 | Schowalter et al. |
| 9,478,718 | B2 | 10/2016 | Kim |
| 2007/0181869 | A1 * | 8/2007 | Gaska ................... B82Y 20/00 |
| | | | 257/14 |
| 2008/0247435 | A1 | 10/2008 | Choi |
| 2011/0193057 | A1 | 8/2011 | Sabathil |
| 2013/0037820 | A1 | 2/2013 | Tsukihara et al. |
| 2013/0069035 | A1 | 3/2013 | Kikuchi et al. |
| 2013/0099141 | A1 | 4/2013 | Chua |
| 2015/0179881 | A1 | 6/2015 | Sénès et al. |
| 2015/0280056 | A1 | 10/2015 | Northrup et al. |
| 2015/0280057 | A1 | 10/2015 | Grandusky et al. |
| 2016/0149078 | A1 | 5/2016 | Takeuchi et al. |

FOREIGN PATENT DOCUMENTS

| | | |
|---|---|---|
| KR | 10-2010-0003331 | 1/2010 |
| KR | 10-2015-0032050 | 3/2015 |
| KR | 10-2015-0062530 | 6/2015 |

\* cited by examiner

ULTRAVIOLET LIGHT-EMITTING DEVICES INCORPORATING GRADED LAYERS AND COMPOSITIONAL OFFSETS

RELATED APPLICATIONS

This application is a continuation of U.S. patent application Ser. No. 15/267,470, filed Sep. 16, 2016, which claims the benefit of and priority to U.S. Provisional Patent Application No. 62/219,881, filed Sep. 17, 2015, and U.S. Provisional Patent Application No. 62/237,027, filed Oct. 5, 2015, the entire disclosure of each of which is hereby incorporated herein by reference.

TECHNICAL FIELD

In various embodiments, the present invention relates to improving carrier injection efficiency (e.g., the hole injection efficiency) into nitride-based electronic and optoelectronic devices.

BACKGROUND

The output powers, efficiencies, and lifetimes of short-wavelength ultraviolet light-emitting diodes (UV LEDs)—i.e., LEDs that emit light at wavelengths less than 350 nm—based on the nitride semiconductor system remain limited due to high defect levels in the active region. These limitations are particularly problematic (and notable) in devices designed to emit at wavelengths less than 280 nm. Particularly in the case of devices formed on foreign substrates, such as sapphire, defect densities remain high despite significant efforts to reduce them. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power, and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces (i.e., the top surfaces of the devices during epitaxial growth and initial device fabrication prior to bonding) bonded to a patterned submount which is used to make electrical and thermal contact to the LED chip. A good submount material is polycrystalline (ceramic) AlN because of the relatively good thermal expansion match with the AlN chip and because of the high thermal conductivity of this material. Due to the high crystalline perfection that is achievable in the active device region of such devices, internal efficiencies greater than 60% have been demonstrated.

Unfortunately, the photon-extraction efficiency is often still very poor in these devices, ranging from about 4% to about 15% achieved using surface-patterning techniques—much lower than exhibited by many visible-light (or "visible") LEDs. Thus, the current generation of short-wavelength UV LEDs has low wall-plug efficiencies (WPEs) of, at best, only a few percent, where the WPE is defined as the ratio of usable optical power (in this case, emitted UV light) achieved from the diode to the electrical power supplied into the device. The WPE of an LED may be calculated by taking the product of the electrical efficiency ($\eta_{el}$), the photon extraction efficiency ($\eta_{ex}$), and the internal efficiency (IE); i.e., WPE=$\eta_{el} \times \eta_{ex} \times$IE. The IE itself is the product of current injection efficiency ($\eta_{inj}$) and the internal quantum efficiency (IQE); i.e., IE=$\eta_{inj} \times$IQE. Thus, a low $\eta_{ex}$ will deleteriously impact the WPE even after the IE has been improved via the reduction of internal crystalline defects enabled by, e.g., the use of the AlN substrates referenced above as platforms for the devices.

There are several possible contributors to low photon-extraction efficiency. For example, currently available AlN substrates generally have some absorption in the UV wavelength range, even at wavelengths longer than the band edge in AlN (which is approximately 210 nm). This absorption tends to result in some of the UV light generated in the active area of the device being absorbed in the substrate, hence diminishing the amount of light emitted from the substrate surface. However, this loss mechanism may be mitigated by thinning the AlN as described in U.S. Pat. No. 8,080,833 ("the '833 patent," the entire disclosure of which is incorporated by reference herein) and/or by reducing the absorption in the AlN substrate as described in U.S. Pat. No. 8,012,257 (the entire disclosure of which is incorporated by reference herein). Additionally, UV LEDs typically suffer because approximately 50% of the generated photons are directed toward the p-contact, which typically includes photon-absorbing p-GaN. Even when photons are directed toward the AlN surface, only about 9.4% typically escape from an untreated surface due to the large index of refraction of the AlN, which results in a small escape cone. These losses are multiplicative and the average photon extraction efficiency may be quite low.

As demonstrated in a recent publication by Grandusky et al. (James R. Grandusky et al., 2013 Appl. Phys. Express, Vol. 6, No. 3, 032101, hereinafter referred to as "Grandusky 2013," the entire disclosure of which is incorporated by reference herein), it is possible to increase the photon extraction efficiency to approximately 15% in pseudomorphic UV LEDs grown on AlN substrates via the attachment of an inorganic (and typically rigid) lens directly to the LED die via a thin layer of an encapsulant (e.g., an organic, UV-resistant encapsulant compound). This encapsulation approach, which is also detailed in U.S. patent application Ser. No. 13/553,093, filed on Jul. 19, 2012 ("the '093 application," the entire disclosure of which is incorporated by reference herein), increases the critical angle of total internal reflection through the top surface of the semiconductor die, which significantly improves photon-extraction efficiency for the UV LEDs. In addition, and as mentioned above, the photon extraction efficiency may be increased by thinning the AlN substrate and by roughening the surface of the AlN substrate surface as discussed in the '833 patent.

In addition, techniques for improved contact metallurgy and planarity have been detailed in U.S. patent application Ser. No. 14/208,089, filed Mar. 13, 2014, and U.S. patent application Ser. No. 14/208,379, filed Mar. 13, 2014, the entire disclosures of which are incorporated herein by reference. Such techniques improve device performance of UV LEDs produced on AlN substrates. However, the carrier injection efficiency, carrier spreading, and thus other characteristics (such as WPE) of the devices detailed in these applications may be less than ideal. Thus, there is a need for optimized epitaxial device structures for UV light-emitting devices that further optimize device efficiency.

SUMMARY

In various embodiments of the present invention, a nitride light-emitting device structure features a doped (e.g., p-doped) cap layer for making electrical contact to a metallic contact, as well as a graded layer disposed beneath the cap layer for the generation of carriers (e.g., holes) via piezoelectric polarization. Surprisingly, the performance of the light-emitting device is improved via the incorporation of compositional discontinuities (or "offsets") at one or both ends (i.e., the top and/or bottom) of the graded layer with respect to the layer disposed below the graded layer (e.g., an electron blocking layer) and/or with respect to the cap layer above the graded layer. Conventionally, such compositional offsets, and the increased lattice mismatch between the graded layer and the layer(s) above and/or below the graded layer associated therewith, may be expected to increase defect density in light-emitting devices and therefore deleteriously impact the efficiency and performance of such devices. In accordance with embodiments of the present invention, each compositional offset may result in the formation of a two-dimensional hole gas proximate thereto, improving the vertical (i.e., substantially perpendicular to the surface of the device) carrier injection efficiency and/or the horizontal (i.e., in the plane parallel to that of the layers and the interfaces therebetween) current spreading within the device, thereby enhancing device performance. In this manner, the luminous efficiency of the light-emitting device is improved compared to devices lacking such graded layers and compositional offsets.

The term two-dimensional hole gas (2DHG) is used herein to refer to a localized enhancement in the hole concentration near an interface in the semiconductor device structure as a function of the distance (z) from the surface of the device. (Likewise, the term two-dimensional electron gas (2DEG) is the equivalent structure for electrons; the term two-dimensional carrier gas may be utilized to refer to a 2DHG or a 2DEG.) In accordance with embodiments of the invention, formation of 2DHGs is due at least in part to abrupt compositional changes in the device structure such as abrupt changes in the Al concentration during growth of an $Al_{1-x}Ga_xN$ alloy. The enhancement in hole concentration in a 2DHG is spread over a certain distance $\Delta z$ (e.g., a distance of approximately 0.5 nm to approximately 15 nm, or approximately 0.5 nm to approximately 10 nm, or approximately 1 nm to approximately 10 nm). If $\Delta z$ is small enough, then quantization in the allowed hole wavefunctions may be seen in the z direction. However, this quantization of wavefunctions may not be necessary for the enhancements of efficiency in accordance with embodiments of the invention. The enhancement in the hole concentration in the 2DHG is related to $\Delta z$ as well as to the compositional offset. In various embodiments, the enhancement may be increased by making $\Delta z$ smaller than 10 nm and, in some embodiments, less than 3 nm. By adjusting the offset and tailoring the graded layer (e.g. the shape of the grade and/or grading rate) to control $\Delta z$, $\Delta z$ may be less than 1 nm. In various embodiments, the grade (i.e., gradient in composition) of the graded layer may be, e.g., linear, sublinear, or superlinear.

Relatedly, embodiments of the present invention also may utilize polarization doping to achieve carrier (e.g., hole) concentrations much higher than may be achieved through the use of only conventional impurity doping. Embodiments of the invention may thus also have improved carrier mobilities due to lack of impurity scattering and reduced temperature dependence of the carrier (e.g., hole) concentration. High carrier (e.g., hole) concentrations in embodiments of the invention may be achieved in the absence of impurity doping or in addition to impurity doping.

References made herein to AlGaN or $Al_{1-a}Ga_aN$ alloys and layers (a being any subscript that may be provided in references to AlGaN herein) are understood to optionally include indium (In) unless the alloy or layer in question is specifically described as being substantially free of In; thus, references made herein to AlGaN or $Al_{1-a}Ga_aN$ are understood to be equivalent to AlInGaN or $Al_{1-a-b}Ga_aIn_bN$ unless otherwise specified. As utilized herein, a layer or alloy being "substantially free of In" means that the layer or alloy is free of In in any but trace amounts, which may be detectable via chemical analysis but do not affect band gap or other properties of the layer or alloy by more than 1% (or, in some embodiments, by more than 0.5% or by more than 0.1%).

In an aspect, embodiments of the invention feature an ultraviolet (UV) light-emitting device that includes, consists essentially of, or consists of a substrate, an active, light-emitting device structure disposed over the substrate, an electron blocking layer disposed over the active, light-emitting device structure, a graded $Al_zGa_{1-z}N$ layer disposed over the electron blocking layer, a p-doped $Al_wGa_{1-w}N$ cap layer disposed over the graded layer, and a metallic contact disposed over the $Al_wGa_{1-w}N$ cap layer. The substrate has an $Al_uGa_{1-u}N$ top surface, where $0 \leq u \leq 1.0$, or even where $0.4 \leq u \leq 1.0$. The light-emitting device structure includes, consists essentially of, or consists of a multiple-quantum well layer. The multiple-quantum well layer includes, consists essentially of, or consists of one or more quantum wells each with a barrier layer thereon and a barrier layer therebelow. For example, the multiple-quantum layer may include, consist essentially of, or consist of a plurality of periods each comprising a strained $Al_xGa_{1-x}N$ barrier and a strained $Al_yGa_{1-y}N$ quantum well, x and y being different by an amount facilitating confinement of charge carriers (i.e., electrons and/or holes) in the multiple-quantum well layer. The electron blocking layer includes, consists essentially of, or consists of $Al_vGa_{1-v}N$, wherein v>y and/or v>x. The composition of the graded layer is graded in Al concentration z such that the Al concentration z decreases in a direction away from the light-emitting device structure. In the cap layer, $0 \leq w \leq 0.4$, or even $0 \leq w \leq 0.2$. The metallic contact includes, consists essentially of, or consists of at least one metal. At an interface between the graded layer and the electron blocking layer, the Al concentration z of the graded layer is less than the Al concentration v of the electron blocking layer by an amount no less than 0.03 (or 0.05, or 0.1, or 0.15, or 0.2, or 0.25, or 0.3) and by an amount no more than 0.85 (or 0.8, or 0.75, or 0.7, or 0.65, or 0.6, or 0.55, or 0.5, or 0.45). At an interface between the graded layer and the cap layer, the Al concentration w of the cap layer is less than the Al concentration z of the graded layer by an amount no less than 0.03 (or 0.05, or 0.1, or 0.15, or 0.2, or 0.25, or 0.3) and by an amount no more than 0.85 (or 0.8, or 0.75, or 0.7, or 0.65, or 0.6, or 0.55, or 0.5, or 0.45).

Embodiments of the invention may include one or more of the following in any of a variety of combinations. The graded layer may be undoped (i.e., not intentionally doped and/or having a dopant concentration and/or carrier concentration therein of less than $10^{13}$ cm$^{-3}$, less than $10^{12}$ cm$^{-3}$, less than $10^{11}$ cm$^{-3}$, or even less than $10^{10}$ cm$^{-3}$). The graded layer may be n-type doped or p-type doped. The Al concentration w of the cap layer may be between 0 and 0.2, between 0 and 0.15, between 0 and 0.1, between 0 and 0.05, or approximately 0. The Al concentration w of the cap layer may be no less than 0.05 or no less than 0.1, and no more than 0.3, no more than 0.25, no more than 0.2, or no more than 0.15. The substrate may include, consist essentially of, or consist of doped and/or undoped AlN. The substrate may be single-crystalline. The substrate may have one or more epitaxial layers disposed thereon. One or more such epitaxial layers may be disposed below the light-emitting device structure. The light-emitting device may include, consist essentially of, or consist of a light-emitting diode (e.g., a bare-die light-emitting diode or a light-emitting diode chip) or a laser (e.g., a bare-die laser or a laser chip). The thickness of the cap layer may be no less than 1 nm, no less than 2 nm, no less than 5 nm, or no less than 10 nm. The thickness of the cap layer may be no more than 50 nm, no more than 45 nm, no more than 40 nm, no more than 35 nm, no more than 30 nm, no more than 25 nm, no more than 20 nm, or no more than 15 nm.

The device may include an n-doped $Al_nGa_{1-n}N$ bottom contact layer disposed between the substrate and the multiple-quantum well layer. In the bottom contact layer, y may be less than n and/or n may be less than x. The device may include a reflection layer disposed over at least a portion of the cap layer. The reflection layer may have a reflectivity to light emitted by the light-emitting device structure (e.g., UV and/or visible light) larger than a reflectivity to light emitted by the light-emitting device structure of the metallic contact. The reflection layer may include, consist essentially of, or consist of Al and/or polytetrafluoroethylene. The device may include a transmissive layer disposed between at least a portion of the reflection layer and the cap layer. The transmissive layer may have a transmissivity to light emitted by the light-emitting structure larger than a transmissivity to light emitted by the light-emitting structure of the metallic contact. The transmissive layer may include, consist essentially of, or consist of an oxide and/or nitride layer. The transmissive layer may be electrically insulating. The transmissive layer may be less electrically conductive than the metallic contact and/or than the reflective layer. The transmissive layer may include, consist essentially of, or consist of silicon oxide, silicon nitride, aluminum oxide, and/or gallium oxide.

In another aspect, embodiments of the invention feature an ultraviolet (UV) light-emitting device that includes, consists essentially of, or consists of a substrate, an active, light-emitting device structure disposed over the substrate, an electron blocking layer disposed over the active, light-emitting device structure, a graded $Al_zGa_{1-z}N$ layer disposed over the electron blocking layer, a p-doped $Al_wGa_{1-w}N$ cap layer disposed over the graded layer, and a metallic contact disposed over the $Al_wGa_{1-w}N$ cap layer. The substrate has an $Al_uGa_{1-u}N$ top surface, where $0 \leq u \leq 1.0$, or even where $0.4 \leq u \leq 1.0$. The light-emitting device structure includes, consists essentially of, or consists of a multiple-quantum well layer. The multiple-quantum well layer includes, consists essentially of, or consists of one or more quantum wells each with a barrier layer thereon and a barrier layer therebelow. For example, the multiple-quantum layer may include, consist essentially of, or consist of a plurality of periods each comprising a strained $Al_xGa_{1-x}N$ barrier and a strained $Al_yGa_{1-y}N$ quantum well, x and y being different by an amount facilitating confinement of charge carriers (i.e., electrons and/or holes) in the multiple-quantum well layer. The electron blocking layer includes, consists essentially of, or consists of $Al_vGa_{1-v}N$, wherein v>y and/or v>x. The composition of the graded layer is graded in Al concentration z such that the Al concentration z decreases in a direction away from the light-emitting device structure. In the cap layer, $0 \leq w \leq 0.4$, or even $0 \leq w \leq 0.2$. The metallic contact includes, consists essentially of, or consists of at least one metal. At an interface between the graded layer and the electron blocking layer, the Al concentration z of the graded layer is less than the Al concentration v of the electron blocking layer by an amount no less than 0.03 (or 0.05, or 0.1, or 0.15, or 0.2, or 0.25, or 0.3) and by an amount no more than 0.85 (or 0.8, or 0.75, or 0.7, or 0.65, or 0.6, or 0.55, or 0.5, or 0.45).

Embodiments of the invention may include one or more of the following in any of a variety of combinations. The graded layer may be undoped (i.e., not intentionally doped and/or having a dopant concentration and/or carrier concentration therein of less than $10^{13}$ cm$^{-3}$, less than $10^{12}$ cm$^{-3}$, less than $10^{11}$ cm$^{-3}$, or even less than $10^{10}$ cm$^{-3}$). The graded layer may be n-type doped or p-type doped. The Al concentration z of the graded layer at an interface between the graded layer and the cap layer may be approximately equal to the Al concentration w of the cap layer. The Al concentration w of the cap layer may be between 0 and 0.2, between 0 and 0.15, between 0 and 0.1, between 0 and 0.05, or approximately 0. The Al concentration w of the cap layer may be no less than 0.05 or no less than 0.1, and no more than 0.3, no more than 0.25, no more than 0.2, or no more than 0.15. The substrate may include, consist essentially of, or consist of doped and/or undoped AlN. The substrate may be single-crystalline. The substrate may have one or more epitaxial layers disposed thereon. One or more such epitaxial layers may be disposed below the light-emitting device structure. The light-emitting device may include, consist essentially of, or consist of a light-emitting diode (e.g., a bare-die light-emitting diode or a light-emitting diode chip) or a laser (e.g., a bare-die laser or a laser chip). The thickness of the cap layer may be no less than 1 nm, no less than 2 nm, no less than 5 nm, or no less than 10 nm. The thickness of the cap layer may be no more than 50 nm, no more than 45 nm, no more than 40 nm, no more than 35 nm, no more than 30 nm, no more than 25 nm, no more than 20 nm, or no more than 15 nm.

The device may include an n-doped $Al_nGa_{1-n}N$ bottom contact layer disposed between the substrate and the multiple-quantum well layer. In the bottom contact layer, y may be less than n and/or n may be less than x. The device may include a reflection layer disposed over at least a portion of the cap layer. The reflection may have a reflectivity to light emitted by the light-emitting device structure (e.g., UV and/or visible light) larger than a reflectivity to light emitted by the light-emitting device structure of the metallic contact. The reflection layer may include, consist essentially of, or consist of Al and/or polytetrafluoroethylene. The device may include a transmissive layer disposed between at least a portion of the reflection layer and the cap layer. The transmissive layer may have a transmissivity to light emitted by the light-emitting structure larger than a transmissivity to light emitted by the light-emitting structure of the metallic contact. The transmissive layer may include, consist essentially of, or consist of an oxide and/or nitride layer. The transmissive layer may be electrically insulating. The transmissive layer may be less electrically conductive than the metallic contact and/or than the reflective layer. The transmissive layer may include, consist essentially of, or consist of silicon oxide, silicon nitride, aluminum oxide, and/or gallium oxide.

In yet another aspect, embodiments of the invention feature an ultraviolet (UV) light-emitting device that includes, consists essentially of, or consists of a substrate, an active, light-emitting device structure disposed over the substrate, a graded $Al_zGa_{1-z}N$ layer disposed over the light-emitting device structure, a p-doped $Al_wGa_{1-w}N$ cap layer disposed over the graded layer, and a metallic contact disposed over the $Al_wGa_{1-w}N$ cap layer. The substrate has an $Al_uGa_{1-u}N$ top surface, where $0 \leq u \leq 1.0$, or even where $0.4 \leq u \leq 1.0$. The light-emitting device structure includes, consists essentially of, or consists of a multiple-quantum well layer. The multiple-quantum well layer includes, consists essentially of, or consists of one or more quantum wells each with a barrier layer thereon and a barrier layer therebelow. For example, the multiple-quantum layer may include, consist essentially of, or consist of a plurality of periods each comprising a strained $Al_xGa_{1-x}N$ barrier and a strained $Al_yGa_{1-y}N$ quantum well, x and y being different by an amount facilitating confinement of charge carriers (i.e., electrons and/or holes) in the multiple-quantum well layer. The composition of the graded layer is graded in Al concentration z such that the Al concentration z decreases in a direction away from the light-emitting device structure. In the cap layer, $0 \leq w \leq 0.4$, or even $0 \leq w \leq 0.2$. The metallic contact includes, consists essentially of, or consists of at least one metal. At an interface between the graded layer and the cap layer, the Al concentration w of the cap layer is less than the Al concentration z of the graded layer by an amount no less than 0.03 (or 0.05, or 0.1, or 0.15, or 0.2, or 0.25, or 0.3) and by an amount no more than 0.85 (or 0.8, or 0.75, or 0.7, or 0.65, or 0.6, or 0.55, or 0.5, or 0.45).

Embodiments of the invention may include one or more of the following in any of a variety of combinations. The graded layer may be undoped (i.e., not intentionally doped and/or having a dopant concentration and/or carrier concentration therein of less than $10^{13}$ cm$^{-3}$, less than $10^{12}$ cm$^{-3}$, less than $10^{11}$ cm$^{-3}$, or even less than $10^{10}$ cm$^{-3}$). The graded layer may be n-type doped or p-type doped. The device may include an electron blocking layer disposed between the light-emitting device structure and/or the multiple-quantum well layer and the graded layer. The electron blocking layer may include, consist essentially of, or consist of $Al_vGa_{1-v}N$. In the electron blocking layer, v may be greater than y and/or v may be greater than x. The Al concentration z of the graded layer at an interface between the graded layer and the electron blocking layer may be approximately equal to the Al concentration v of the electron blocking layer. The Al concentration w of the cap layer may be between 0 and 0.2, between 0 and 0.15, between 0 and 0.1, between 0 and 0.05, or approximately 0. The Al concentration w of the cap layer may be no less than 0.05 or no less than 0.1, and no more than 0.3, no more than 0.25, no more than 0.2, or no more than 0.15. The substrate may include, consist essentially of, or consist of doped and/or undoped AlN. The substrate may be single-crystalline. The substrate may have one or more epitaxial layers disposed thereon. One or more such epitaxial layers may be disposed below the light-emitting device structure. The light-emitting device may include, consist essentially of, or consist of a light-emitting diode (e.g., a bare-die light-emitting diode or a light-emitting diode chip) or a laser (e.g., a bare-die laser or a laser chip). The thickness of the cap layer may be no less than 1 nm, no less than 2 nm, no less than 5 nm, or no less than 10 nm. The thickness of the cap layer may be no more than 50 nm, no more than 45 nm, no more than 40 nm, no more than 35 nm, no more than 30 nm, no more than 25 nm, no more than 20 nm, or no more than 15 nm.

The device may include an n-doped $Al_nGa_{1-n}N$ bottom contact layer disposed between the substrate and the multiple-quantum well layer. In the bottom contact layer, y may be less than n and/or n may be less than x. The device may include a reflection layer disposed over at least a portion of the cap layer. The reflection may have a reflectivity to light emitted by the light-emitting device structure (e.g., UV and/or visible light) larger than a reflectivity to light emitted by the light-emitting device structure of the metallic contact. The reflection layer may include, consist essentially of, or consist of Al and/or polytetrafluoroethylene. The device may include a transmissive layer disposed between at least a portion of the reflection layer and the cap layer. The transmissive layer may have a transmissivity to light emitted by the light-emitting structure larger than a transmissivity to light emitted by the light-emitting structure of the metallic contact. The transmissive layer may include, consist essentially of, or consist of an oxide and/or nitride layer. The transmissive layer may be electrically insulating. The transmissive layer may be less electrically conductive than the metallic contact and/or than the reflective layer. The transmissive layer may include, consist essentially of, or consist of silicon oxide, silicon nitride, aluminum oxide, and/or gallium oxide.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean ±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
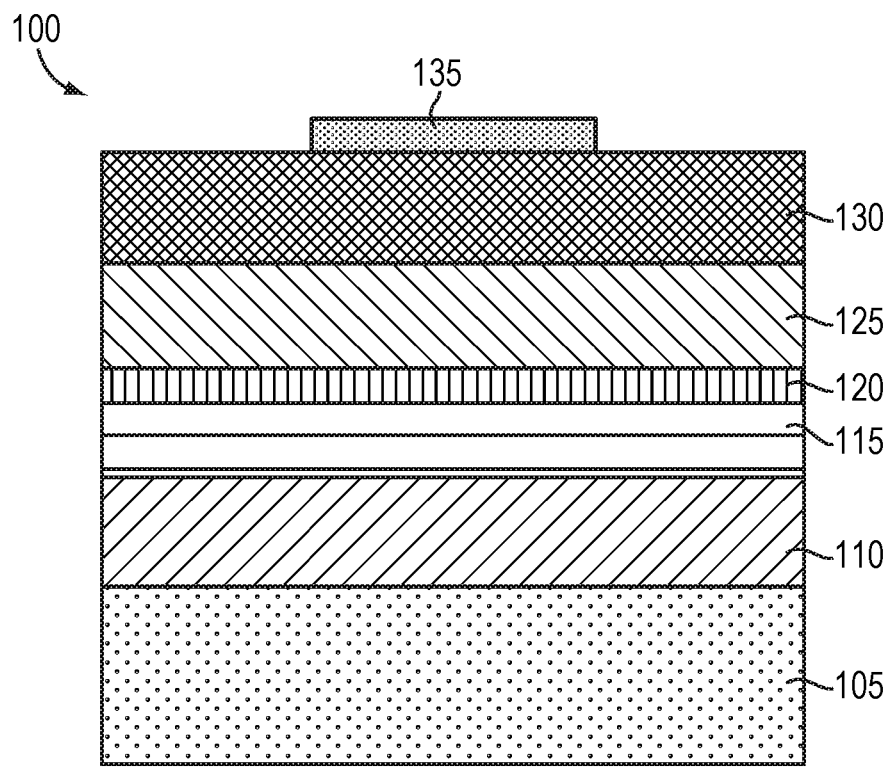
FIG. 1 is a schematic cross-section of a light-emitting device structure in accordance with various embodiments of the invention.

FIG. 1 schematically depicts a light-emitting device structure 100 in accordance with the present invention. Light-emitting device structures 100 in accordance with embodiments of the invention may include, consist essentially of, or consist of, for example, light-emitting diodes or lasers. As shown, the device structure 100 includes a substrate 105, which in various embodiments includes, consists essentially of, or consists of a semiconductor substrate. In various embodiments, the top surface of substrate 105 (i.e., the surface on which other layers in device structure 100 are disposed) is $Al_uGa_{1-u}N$, where $u \geq 0.4$ (and $u \leq 1.0$). All or a portion of the substrate 105 may be undoped (i.e., not intentionally doped) or intentionally doped with one or more species of dopants. The substrate 105 may be substantially entirely composed of the $Al_uGa_{1-u}N$ material (e.g., AlN), or the substrate 105 may include, consist essentially of, or consist of a different material (e.g., silicon carbide, silicon, MgO, $Ga_2O_3$, alumina, ZnO, GaN, InN, and/or sapphire) with the $Al_uGa_{1-u}N$ material formed thereover by e.g., epitaxial growth; such material may be substantially fully lattice relaxed and may have a thickness of, e.g., at least 1 μm.

In various embodiments, the substrate 105 need not be transparent to radiation emitted by the device structure 100 (e.g., UV radiation), since it may be partially or substantially removed during device fabrication. Semiconductor substrate 105 may be miscut such that the angle between its c-axis and its surface normal is between approximately 0° and approximately 4°. In various embodiments, the misorientation of the surface of substrate 105 is less than approximately 0.3°, e.g., for substrates 105 that are not deliberately or controllably miscut. In other embodiments, the misorientation of the surface of substrate 105 is greater than approximately 0.3°, e.g., for substrates 105 that are deliberately and controllably miscut. In various embodiments, the direction of the miscut is towards the a-axis. The surface of substrate 105 may have a group-III (e.g., Al—) polarity, and may be planarized, e.g., by chemical-mechanical polishing. The RMS surface roughness of substrate 105 is preferably less than approximately 0.5 nm for a 10 μm–10 μm area. In some embodiments, atomic-level steps are detectable on the surface when probed with an atomic-force microscope. The threading dislocation density of substrate 105 may be measured using, e.g., etch pit density measurements after a 5 minute KOH—NaOH eutectic etch at 450° C. In various embodiments, the threading dislocation density is less than approximately $2 \times 10^3$ cm$^{-2}$. In some embodiments substrate 105 has an even lower threading dislocation density. Substrate 105 may be topped with a homoepitaxial layer (not shown) that includes, consists essentially of, or consists of the same material present in or on substrate 105, e.g., AlN.

The various layers of device structure 100 disposed over substrate 105 may be formed by any of a variety of different techniques, e.g., epitaxial growth techniques such as chemical vapor deposition (CVD) methods such as metallorganic CVD (MOCVD).

Device structure 100 also includes a bottom contact layer 110 disposed over the substrate 105. In various embodiments, the bottom contact layer 110 is n-type doped, e.g., doped with an impurity such as P, As, Sb, C, H, F, O, Mg, and/or Si. The bottom contact layer 110 may include, consist essentially of, or consist of, for example, $Al_xGa_{1-x}N$, and the aluminum concentration x may be approximately the same as, or different then, the corresponding aluminum content in substrate 105. In an embodiment, an optional graded buffer layer (not shown) is disposed above substrate 105 and below bottom contact layer 110. The graded buffer layer may include, consist essentially of, or consist of one or more semiconductor materials, e.g., $Al_xGa_{1-x}N$. In various embodiments, the graded buffer layer has a composition approximately equal to that of substrate 105 at an interface therewith in order to promote two-dimensional growth and avoid deleterious islanding (such islanding may result in undesired elastic strain relief and/or surface roughening in the graded buffer layer and subsequently grown layers). The composition of the graded buffer layer at an interface with bottom contact layer 110 may be chosen to be close to (e.g., approximately equal to) that of the desired active region of the device (e.g., the $Al_xGa_{1-x}N$ concentration that will result in the desired wavelength emission from the light-emitting device). In an embodiment, the graded buffer layer includes, consists essentially of, or consists of doped or undoped $Al_xGa_{1-x}N$ graded from an Al concentration x of approximately 100% to an Al concentration x of approximately 60%.

The bottom contact layer 110 may have a thickness sufficient to prevent current crowding after device fabrication and/or to stop on during etching to fabricate contacts. For example, the thickness of bottom contact layer 320 may range from approximately 100 nm to approximately 500 nm, or from approximately 100 nm to approximately 2 μm. When utilizing a bottom contact layer 110, the final light-emitting device may be fabricated with back-side contacts. In various embodiments, bottom contact layer 110 will have high electrical conductivity even with a small thickness due to the low defect density maintained when the layer is pseudomorphic. As utilized herein, a pseudomorphic film is one where the strain parallel to the interface between the film and an underlying layer or substrate is approximately that needed to distort the lattice in the film to match that of the substrate (or a relaxed, i.e., substantially unstrained, layer over the substrate and below the pseudomorphic film). Thus, the parallel strain in a pseudomorphic film will be nearly or approximately equal to the difference in lattice parameters between an unstrained substrate parallel to the interface and an unstrained epitaxial layer parallel to the interface.

As shown in FIG. 1, device structure also includes an active light-emitting device structure (i.e., one or more layers (e.g., quantum wells) configured for the emission of light in response to an applied voltage) disposed over the bottom contact layer 110. For example, the active light-emitting device structure may include, consist essentially of, or consist of a multiple-quantum well ("MQW") layer 115 disposed above bottom contact layer 110. In various embodiments, MQW layer 115 is disposed directly on the bottom contact layer 110. In other embodiments, an optional layer (e.g., an undoped layer including, consisting essentially of, or consisting of an undoped semiconductor material such as AlGaN) may be disposed between the bottom contact layer 110 and the MQW layer 115. The MQW layer 115 may be doped with the same doping polarity as the bottom contact layer 110, e.g., n-type doped. The MQW layer 115 may include, consist essentially of, or consist of one or more quantum wells separated by (or surrounded on both sides by) barriers. For example, each period of MQW layer 115 may feature an $Al_xGa_{1-x}N$ quantum well and an $Al_yGa_{1-y}N$ barrier, where x is different from y. Typically, y is greater than 0.4 for light-emitting devices designed to emit light having a wavelength less than 300 nm and may be greater than 0.7 for shorter-wavelength emitters. It may even be greater than 0.9 for devices designed to emit at wavelengths shorter than 250 nm. The value of x will, at least in part, determine the emission wavelength of the device. For emission wavelengths longer than 280 nm, x may be as low as 0.2. For wavelengths between 250 nm and 280 nm, x may vary between 0.2 and 0.7. For wavelengths shorter than 250 nm, x may be greater than 0.6. In various embodiments, the difference between x and y is large enough to obtain good confinement of the electrons and holes in the active region, thus enabling high ratio of radiative recombination to non-radiative recombination. In an embodiment, the difference between x and y is approximately 0.25, e.g., x is approximately 0.5 and y is approximately 0.75. MQW layer 115 may include a plurality of such periods, and may have a total thickness ranging from 20 nm to 100 nm, or less than approximately 50 nm.

In various embodiments of the invention, an electron-blocking layer 120 may be disposed over the active light-emitting device structure of device structure 100 (e.g., disposed above MQW layer 115). The electron-blocking layer 120 typically has a wider band gap than that of a band gap within the MQW layer 115 (e.g., a band gap of the barrier layers therewithin). In various embodiments, the electron-blocking layer 120 may include, consist essentially of, or consist of e.g., $Al_xGa_{1-x}N$, and electron-blocking layer 120 may be doped. For example, the electron-blocking layer 120 may be doped with the same doping polarity as that of bottom contact layer 110 and/or MQW layer 115 (e.g., n-type doped). In various embodiments, the value of x in the electron-blocking layer 120 is greater than the value of the Al mole fraction in the barrier layers used in the MQW layer 115. For longer wavelength devices with emission wavelengths greater than 300 nm, x may be as low as 0.4 and may be greater than 0.7 for shorter wavelength devices. It may even be greater than 0.9 for devices designed to emit at wavelengths shorter than 250 nm. Electron-blocking layer 120 may have a thickness that may range, for example, between approximately 10 nm and approximately 50 nm, or even between approximately 10 nm and approximately 30 nm. In various embodiments of the invention, the electron-blocking layer 120 is sufficiently thin (e.g., thickness less than about 30 nm, or less than about 20 nm) so as to facilitate carrier (e.g., hole) tunneling through the electron-blocking layer 120. In various embodiments of the invention, the electron-blocking layer 120 is omitted from device structure 100.

As shown in FIG. 1, device structure 100 may also include a graded layer 125 disposed above the electron-blocking layer 120 (or above the active light-emitting device structure in embodiments in which electron-blocking layer 120 is omitted), and a cap layer 130 may be disposed over the graded layer 125. The cap layer 130 may be doped with a doping polarity opposite of that of the bottom contact layer 110, e.g., p-type doped with one or more dopants such as Mg, Be, and/or Zn. In other embodiments, the cap layer 130 may be undoped, as carriers (e.g., holes) may be injected from an electrode into a two-dimensional carrier gas disposed at the interface between the cap layer 130 and the graded layer 125. (While in exemplary embodiments described herein the cap layer 130 is doped p-type and the bottom contact layer 110 is doped n-type, embodiments in which the doping polarities of these layers are switched are within the scope of the present invention; in such embodiments, the electron-blocking layer 120, if present, may be considered to be a "hole-blocking layer," as understood by those of skill in the art.) The cap layer 130 may have a thickness ranging from, e.g., approximately 1 nm to approximately 100 nm, or approximately 1 nm to approximately 50 nm, or approximately 1 nm to approximately 20 nm. In various embodiments, the cap layer 130 includes, consists essentially of, or consists of $Al_xGa_{1-x}N$, and in various embodiments the aluminum concentration x may range from 0 (i.e., pure GaN) to approximately 0.2.

Analysis of graded layer 125 may be performed by using various analysis methods such as X-ray diffraction (XRD), energy dispersive X-ray spectrometry (EDX), X-ray fluorescence analysis (XRF), auger electron spectroscopy (AES), secondary ion mass spectrometry (SIMS), electron energy loss spectrum (EELS), and/or an atom probe (AP). For example, graded layer 125 may exhibit a gradient in composition exceeding a measurement accuracy of one or more such analytical techniques.

The device structure 100 may also incorporate a metallic contact to facilitate electrical contact to the device. For example, the metallic contact may include or consist essentially of an electrode layer 135 disposed above or on the cap layer 130. The composition and/or shape of the electrode layer 135 are not particularly limited as long as it enables the injection of carriers (e.g., holes) into the cap layer 130. In embodiments in which holes are injected into a p-type doped nitride-based semiconductor cap layer 130, the electrode layer 135 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Electrode layers 135 in accordance with embodiments of the invention are not limited to these materials. The thickness of the electrode layer 135 may be, for example, between approximately 10 nm and approximately 100 nm, or between approximately 10 nm and approximately 50 nm, or between approximately 10 nm and approximately 30 nm, or between approximately 25 nm and approximately 40 nm.

As mentioned above, embodiments of the present invention feature a graded layer 125 disposed between the cap layer 130 and the electron-blocking layer 120 (or the MQW layer 115 in embodiments in which the electron-blocking layer 120 is omitted). The graded layer 125 typically includes, consists essentially of, or consists of a nitride semiconductor, e.g., a mixture or alloy of Ga, In, and/or Al with N. The compositional gradient within graded layer 125 may be substantially continuous or stepped, and the grading rate within the graded layer 125 may be substantially constant or may change one or more times within the thickness of graded layer 125. The graded layer 125 may be undoped. In other embodiments, the graded layer 125 is doped n-type or p-type with one or more dopants, e.g., C, H, F, O, Mg, Be, Zn, and/or Si. The thickness of the graded layer 125 may be, for example, between approximately 5 nm and approximately 100 nm, between approximately 10 nm and approximately 50 nm, or between approximately 20 nm and approximately 40 nm. In various embodiments, the epitaxial growth process utilized to form the various layers of the device structure 100 may be temporarily halted between growth of the graded layer 125 and the underlying layer and/or the overlying layer. In various embodiments, the graded layer 125 is pseudomorphically strained to one or more of the underlying layers.

In general, the composition as a function of thickness of the graded layer 125 trends from that of the underlying layer (e.g., electron-blocking layer 120 or MQW layer 115) toward that of the overlying layer (e.g., cap layer 130).

Figure 2:
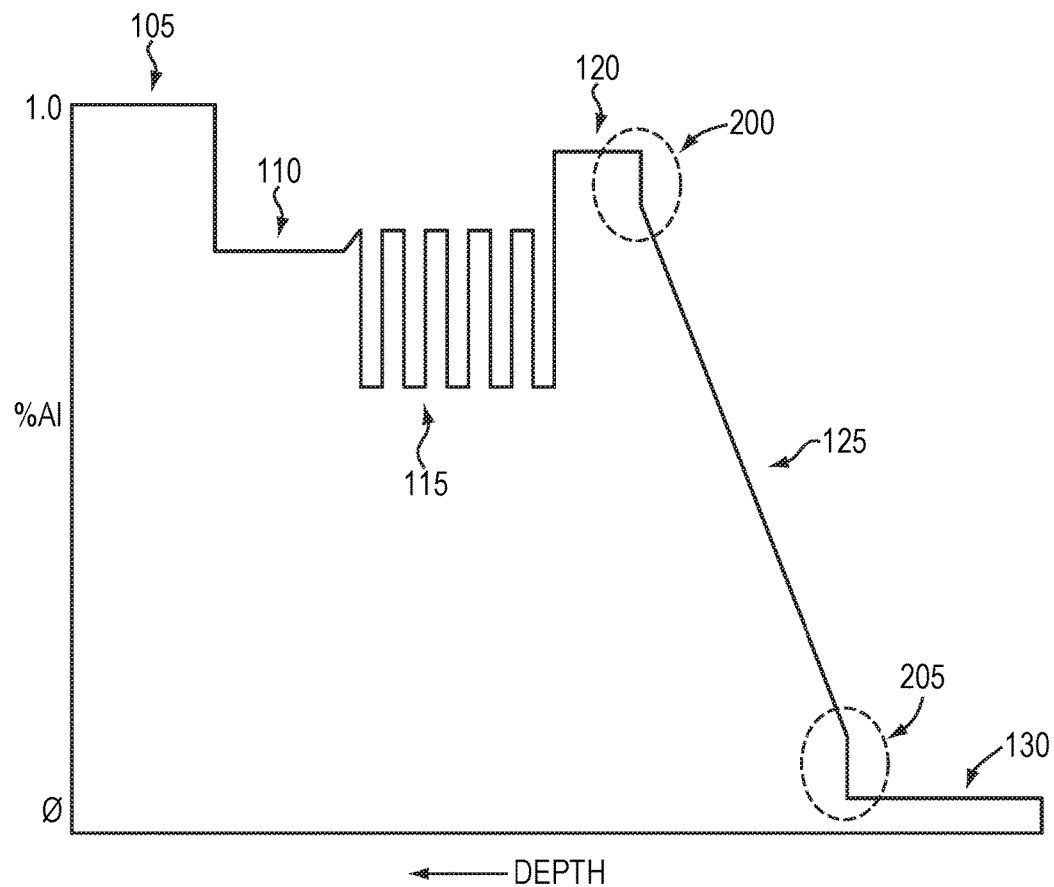
FIG. 2 is a graph of aluminum concentration as a function of depth from the surface for a nitride-based light-emitting device structure in accordance with various embodiments of the invention.

However, in various embodiments, the composition of the graded layer 125 at its interface with electron-blocking layer 120 does not match that of electron blocking layer 120, and/or the composition of the graded layer 125 at its interface with cap layer 130 does not match that of cap layer 130. FIG. 2 shows a (not-to-scale) representation of the aluminum concentration within various layers of an exemplary device structure 100 as a function of depth, where the top surface of the device is toward the right side of the figure. As shown in FIG. 2, the device structure 100 may incorporate a compositional "jump," i.e., an offset or discontinuity in composition, at one or both of the interfaces to graded layer 125 to facilitate the formation of a two-dimensional hole gas at one or both of the interfaces during device operation. The compositional difference(s) between the graded layer 125 and the electron blocking layer 120 and/or the cap layer 130 may be analyzed via one or more of a variety of analysis methods such as X-ray diffraction (XRD), energy dispersive X-ray spectrometry (EDX), X-ray fluorescence analysis (XRF), auger electron spectroscopy (AES), secondary ion mass spectrometry (SIMS), and/or electron energy loss spectrum (EELS).

As shown in FIG. 2, for exemplary device structures 100 in which various layers contain different amounts of aluminum, the device structure 100 may incorporate a compositional offset 200 in aluminum concentration; namely, the aluminum concentration at the initial, bottom portion of the graded layer 125 (e.g., at the interface between the graded layer 125 and the layer underlying it) may be lower than that of the electron-blocking layer 120 and/or the MQW layer 115. This compositional difference 200 may be at least 0.05, or at least 0.1, or at least 0.2, and it may be as large as 0.55, or as large as 0.75 or 0.85, in various embodiments of the invention. Exemplary device structures 100 may also, or instead, incorporate a compositional offset 205 in aluminum concentration; namely, the aluminum concentration at the final, top portion of the graded layer (e.g., at the interface between graded layer 125 and the layer overlying it) may be higher than that of the cap layer 130. This compositional difference 205 may be at least 0.05, or at least 0.1, or at least 0.2, and it may be as large as 0.55, or as large as 0.75 or 0.85, in various embodiments of the invention. Hole injection into the active region (e.g., MQW layer 115) may be enhanced via the compositional offset 200, and hole injection between the active region and the cap layer 130 and/or electrode thereover (and/or carrier and/or current spreading within cap layer 130) may be enhanced via the compositional offset 205. Two-dimensional carrier gases (e.g., two-dimensional hole gases) may thus advantageously form during operation of the light-emitting device proximate compositional offsets 200, 205. In various embodiments of the invention incorporating a compositional offset 205 between the graded layer 125 and the cap layer 130, the cap layer may have a thickness no greater than approximately 20 nm (e.g., between approximately 1 nm and approximately 20 nm, between approximately 1 nm and approximately 10 nm, between approximately 5 nm and approximately 15 nm, or between approximately 5 nm and approximately 10 nm) for greater responsivity of the carriers within the two-dimensional hole gas proximate the compositional offset 205; thicker cap layers 130 may result in loss of at least a portion of the benefits afforded by the two-dimensional hole gas.

Hole concentrations within the graded layer 125 of approximately $2 \times 10^{19}$ cm$^{-3}$ or more, or even $3 \times 10^{19}$ cm$^{-3}$ or more may be achieved through polarization doping without impurity doping (e.g., even being substantially free of doping impurities), as modeled using SiLENSe software available from the STR Group, Inc. of Richmond, Va. In general, polarization doping is enabled by the polarization in nitride materials that is due to the difference in electronegativity between the metal atoms and the nitrogen atoms. This results in a polarization field along asymmetric directions in the wurtzite crystal structure. In addition, strain in the layers may result in additional piezoelectric polarization fields and thus additional polarization doping. These fields create fixed charges at abrupt interfaces (e.g., two-dimensional sheets) or graded composition layers (e.g., three-dimensional volumes), which results in mobile carriers of the opposite sign. The magnitude of the total charge may be defined by, for example, the difference in Al compositions within the graded layer, i.e., the difference between the starting composition and the final composition. The concentration of carriers is defined by the total charge divided by the graded layer thickness. A very high carrier concentration may be achieved by a high composition change over a small thickness, while a lower composition change or larger grading thickness typically results in a smaller carrier concentration; however, for a given composition change the total number of carriers may be approximately constant.

In an exemplary device structure 100 having a compositional offset 200 between electron-blocking layer 120 and graded layer 125, an electron-blocking layer 120 including, consisting essentially of, or consisting of $Al_{0.8}Ga_{0.2}N$ or $Al_{0.85}Ga_{0.15}N$ is formed over MQW layer 115. Prior to formation of a cap layer 130 including, consisting essentially of, or consisting of GaN, a graded layer 125 is formed over electron-blocking layer 120. The graded layer 125 may be graded in composition from, for example, $Al_{0.75}Ga_{0.25}N$ to GaN over a thickness of approximately 30 nm. The graded layer 125 may be formed by, e.g., MOCVD, and in this embodiment is formed by ramping the flow of TMA and TMG (by ramping the flow of hydrogen through their respective bubblers) from the conditions utilized to form a layer of lower Al mole fraction than the electron-blocking layer 120 to 0 standard cubic centimeters per minute (sccm) and 6.4 sccm, respectively, over a period of approximately 24 minutes, thus resulting in a monotonic grade from $Al_{0.75}Ga_{0.25}N$ to GaN (all of the other growth conditions are substantially fixed). The thickness of the graded layer 125 in this exemplary embodiment is approximately 30 nm. It should be emphasized that this particular embodiment is exemplary, and embodiments of the invention feature graded layers 125 having various compositional end points (i.e., various compositions at interfaces with underlying and/or overlying layers) and compositional offsets 200 and/or 205.

In various embodiments of the invention, one or more (or even all) of the layers of device structure 100 may be pseudomorphically strained, similar to device layers described in U.S. patent application Ser. No. 12/020,006, filed on Jan. 25, 2008, U.S. patent application Ser. No. 12/764,584, filed on Apr. 21, 2010, and U.S. patent application Ser. No. 14/208,379, filed on Mar. 13, 2014, the entire disclosure of each of which is incorporated by reference herein. Thus, as detailed therein, in various embodiments, one or more of the layers of device structure 100 may be pseudomorphic and may have a thickness greater than its predicted (e.g., via the Maxwell-Blakeslee theory) critical thickness. Moreover, the collective layer structure of device structure 100 may have a total thickness greater than the predicted critical thickness for the layers considered collectively (i.e., for a multiple-layer structure, the entire structure has a predicted critical thickness even when each individual layer would be less than a predicted critical thickness thereof considered in isolation). In other embodiments, one or more layers of device structure 100 are pseudomorphically strained and cap layer 130 is partially or substantially fully relaxed. For example, the lattice mismatch between cap layer 130 and substrate 105 and/or MQW layer 115 may be greater than approximately 1%, greater than approximately 2%, or even greater than approximately 3%. In an exemplary embodiment, cap layer 130 includes, consists essentially of, or consists of undoped or doped GaN, substrate 105 includes, consists essentially of, or consists of doped or undoped AlN (e.g., single-crystal AlN), and MQW layer 115 includes, consists essentially of, or consists of multiple $Al_{0.55}Ga_{0.45}N$ quantum wells interleaved with $Al_{0.75}Ga_{0.25}N$ barrier layers, and cap layer 130 is lattice mismatched by approximately 2.4%. Cap layer 130 may be substantially relaxed, i.e., may have a lattice parameter approximately equal to its theoretical unstrained lattice constant. A partially or substantially relaxed cap layer 130 may contain strain-relieving dislocations having segments threading to the surface of cap layer 130 (such dislocations may be termed "threading dislocations"). The threading dislocation density of a relaxed cap layer 130 may be larger than that of substrate 105 and/or layers underlying cap layer 130 by, e.g., one, two, or three orders of magnitude, or even larger.

Embodiments of the present invention may incorporate a reflection layer for reflecting at least a portion of the light generated by device structure 100 back away from the reflection layer (e.g., back toward substrate 105 or back contact layer 110). In various embodiments, the electrode layer 135 may form a good ohmic contact to the cap layer 130 but may not be reflective to the light (e.g., UV light) generated within the active device structure of device structure 100 (e.g., MQW layer 115). For example, the electrode layer 135 may include, consist essentially of, or consist of Ni/Au that is not reflective to UV light. In an exemplary embodiment, the contact resistivity of the electrode layer 135 to the cap layer 130 is less than approximately 1.0 $m\Omega\text{-}cm^2$, or even less than approximately 0.5 $m\Omega\text{-}cm^2$. Contact resistance between various metal-based layers (e.g., electrode layer 135 and/or the reflection layer) and the semiconductor-based layers they contact (e.g., cap layer 130) may be determined via, e.g., a transmission line measurement (TLM) method such as the one described in Solid State Electronics, Vol. 25, No. 2, pp. 91-94.

Figure 3A:
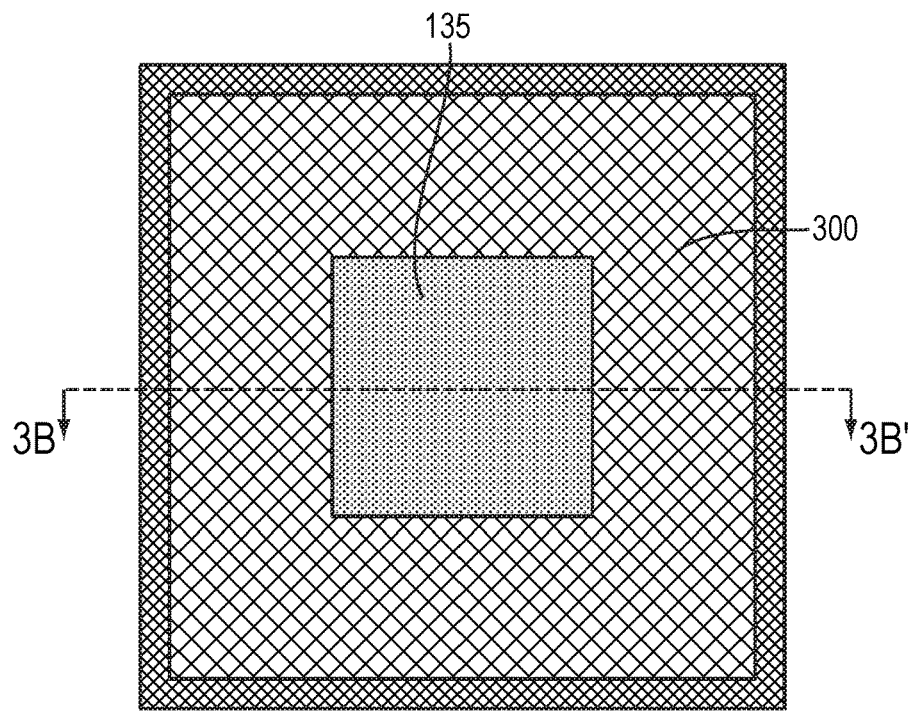
FIG. 3A is a schematic plan view of a light-emitting device structure incorporating an electrode layer and a reflection layer in accordance with various embodiments of the invention.
Figure 3B:
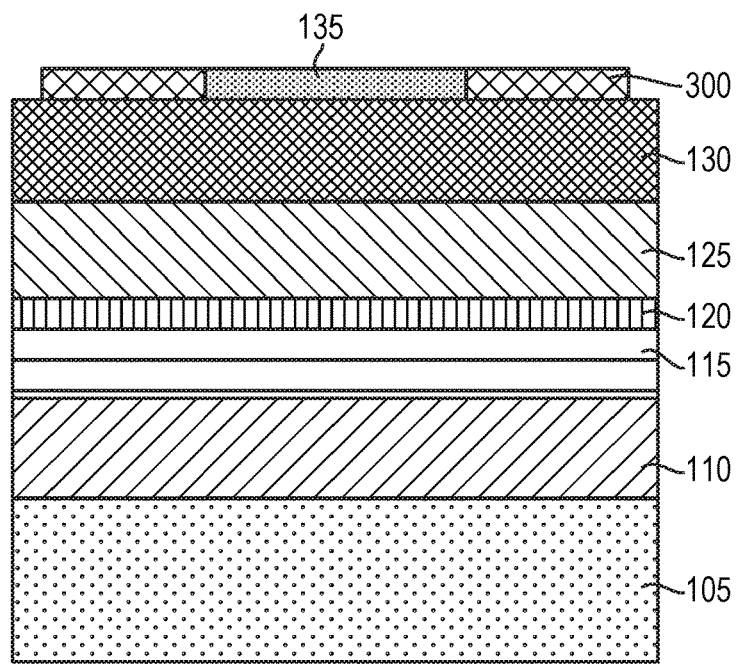
FIG. 3B is a schematic cross-section of the light-emitting device structure of FIG. 3A.

Thus, in various embodiments the electrode layer 135 may be utilized in conjunction with a reflection layer that reflects light generated within the active device structure of device structure 100. For example, as shown in FIGS. 3A and 3B, a reflection layer that is at least partially reflective to the light emitted by device structure 100 may at least partially surround (or even, in some embodiments, at least partially overlap) the electrode layer 135. Depending upon the wavelength of light emitted by the device structure 100, the reflection layer 300 may include, consist essentially of, or consist of, for example, Ag, Rh, and/or Al, a multi-layer dielectric film, or one or more fluoroplastics (e.g., polytetrafluoroethylene (PTFE)), although embodiments of the invention are not limited to such materials. For example, Ag is substantially reflective to various wavelengths of visible light while Al is substantially reflective to various wavelengths of UV light (e.g., >90% reflectivity to light having a wavelength of approximately 265 nm). As shown, electrode layer 135 is still in contact with at least portions of cap layer 130, enabling good ohmic contact to the device structure 100 even if the reflection layer 300 does not form a good ohmic contact to cap layer 130.

Figure 4:
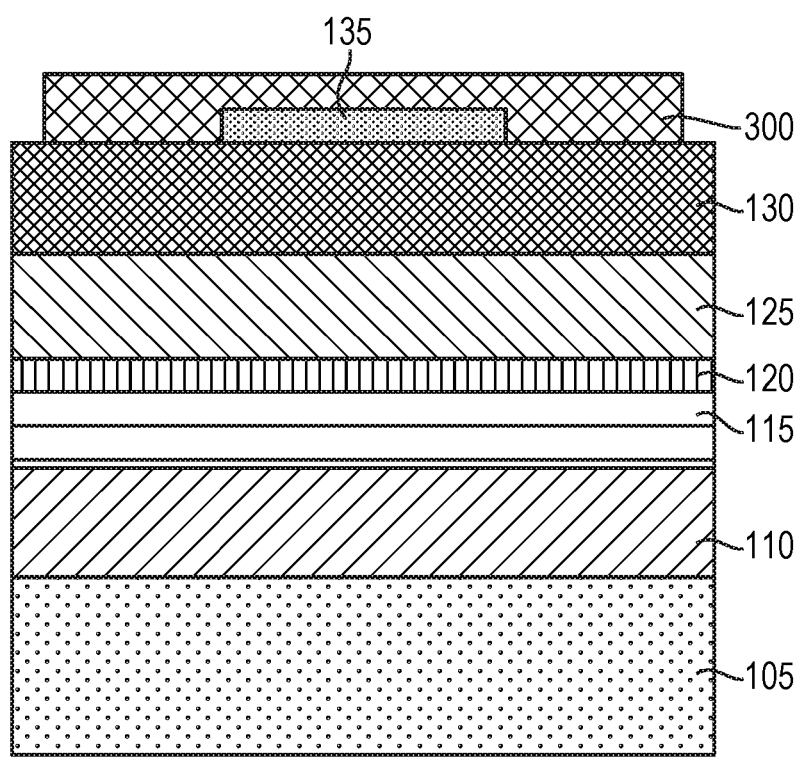
FIGS. 4 and 5 are schematic cross-sections of light-emitting device structures incorporating electrode layers and reflection layers in accordance with various embodiments of the invention.
Figure 5:
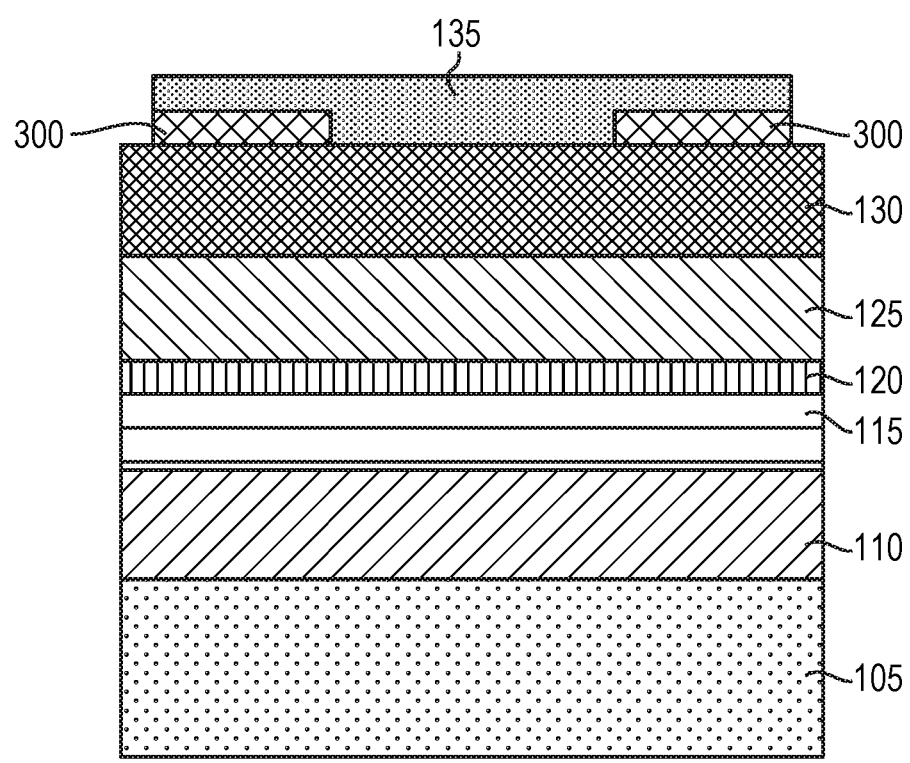

Various different configurations of the electrode layer 135 and/or the reflection layer 300 are possible within embodiments of the present invention. For example, as shown in FIG. 4, the reflection layer 300 may cover the entirety of the electrode layer 135. In such embodiments, the reflection layer 300 may, but does not necessarily, cover substantially the entire top surface of device structure 100. As shown in FIG. 5, in embodiments of the present invention portions (or discrete areas) of the reflection layer 300 may be disposed directly on the cap layer 130, and portions of the electrode layer 135 may overlap such portions of the reflection layer 300 while a portion of the electrode layer 135 makes direct contact with the cap layer 130.

Figure 6:
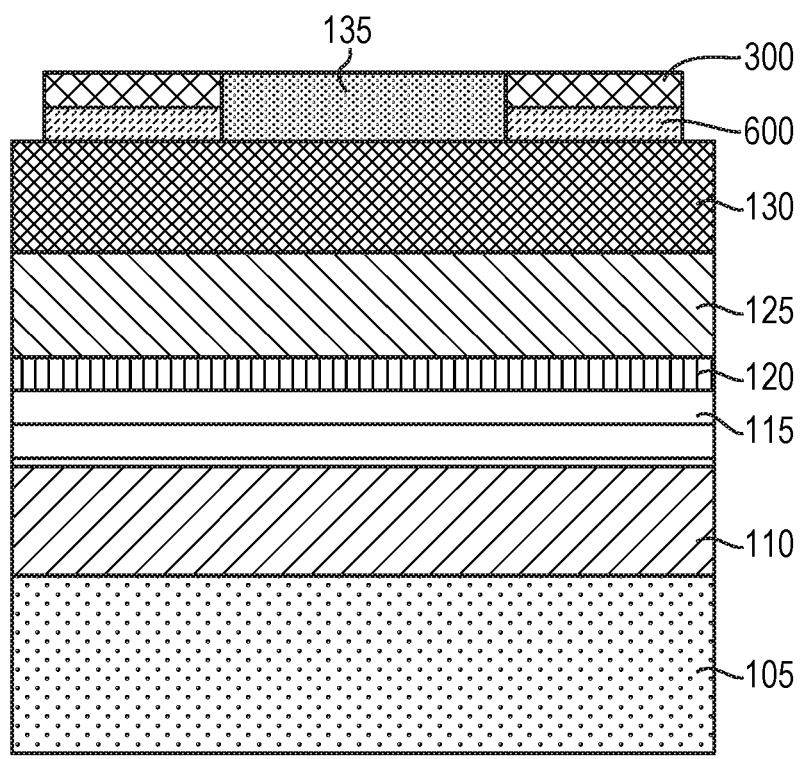
FIGS. 6 and 7 are schematic cross-sections of light-emitting device structures incorporating electrode layers, reflection layers, and transmissive layers in accordance with various embodiments of the invention.
Figure 7:
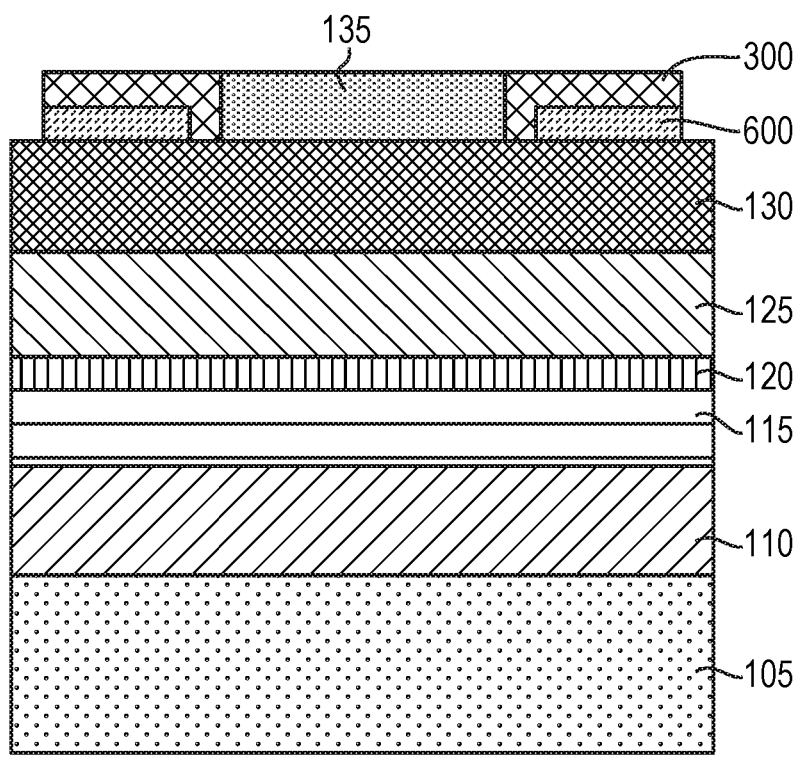

In embodiments of the invention, the device structure may also incorporate a transmissive layer 600 in conjunction with electrode layer 135 and/or reflection layer 300, as shown in FIG. 6. The transmissive layer 600 may include, consist essentially of, or consist of a material having a greater transmissivity to the light emitted by device structure 100 and may even, in some embodiments, be substantially transparent to such light. For example, the transmissive layer 600 may include, consist essentially of, or consist of an insulating material and/or an oxide and/or a nitride such as silicon oxide, silicon nitride, aluminum oxide, and/or gallium oxide. As shown in FIG. 6, the transmissive layer 600 may be disposed between the reflection layer 300 and the cap layer 130, and no portion of the reflection layer 300 directly contacts the cap layer. Alternatively, as shown in FIG. 7, at least portions of the reflection layer 300 may contact the cap layer 130, and the transmissive layer 600 is disposed between other portions of the reflection layer 300 and the cap layer 130.

Figure 8:
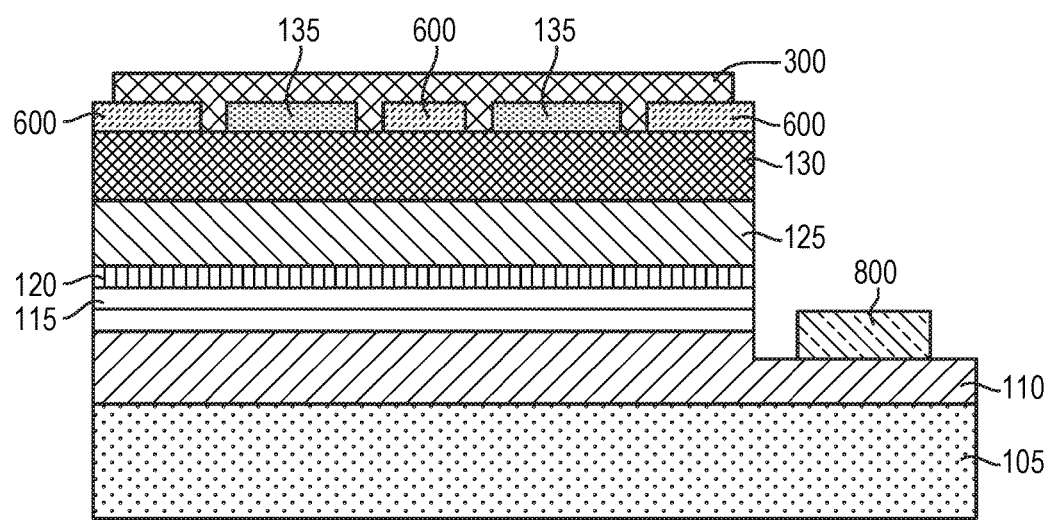
FIG. 8 is a schematic cross-section of a light-emitting device structure having two top contacts in accordance with various embodiments of the invention.

In various embodiments of the invention, electrical contact to the device structure 100 may be made via electrode layer 135 disposed on the top of the device structure and via a contact disposed on the back side of the device structure 100. For example, a back contact may be disposed on the back side of the substrate 105, or, in embodiments in which the substrate 105 is removed after fabrication of the other layers of device structure 105, a back contact may be disposed on the back side of the back contact layer 110. Alternatively, as shown in FIG. 8, in one or more regions various upper layers of the device structure 100 may be removed (e.g., via chemical or dry/plasma etching), and a back contact 800 may be disposed on the top of back contact layer 110 or on the top of an unremoved portion of the back contact layer 110. The back contact 800 may include, consist essentially of, or consist of, for example, one or more of the materials described herein for the electrode layer 135.

Embodiments of the invention may utilize photon-extraction techniques described in the '093 application. Such techniques include surface treatment (e.g., roughening, texturing, and/or patterning), substrate thinning, substrate removal, and/or the use of rigid lenses with thin intermediate encapsulant layers. Exemplary substrate-removal techniques include laser lift-off, as described in "High brightness LEDs for general lighting applications using the new Thin GaN™—Technology", V. Haerle, et al., Phys. Stat. Sol. (a) 201, 2736 (2004), the entire disclosure of which is incorporated by reference herein.

In embodiments in which the device substrate is thinned or removed, the back surface of the substrate may be ground, for example, with a 600 to 1800 grit wheel. The removal rate of this step may be purposefully maintained at a low level (approximately 0.3-0.4 μm/s) in order to avoid damaging the substrate or the device layers thereover. After the optional grinding step, the back surface may be polished with a polishing slurry, e.g., a solution of equal parts of distilled water and a commercial colloidal suspension of silica in a buffered solution of KOH and water. The removal rate of this step may vary between approximately 10 µm/min and approximately 15 µm/min. The substrate may be thinned down to a thickness of approximately 200 µm to approximately 250 µm, or even to a thickness of approximately 20 µm to approximately 50 µm, although the scope of the invention is not limited by this range. In other embodiments, the substrate is thinned to approximately 20 µm or less, or even substantially completely removed. The thinning step is preferably followed by wafer cleaning in, e.g., one or more organic solvents. In one embodiment of the invention, the cleaning step includes immersion of the substrate in boiling acetone for approximately 10 minutes, followed by immersion in boiling methanol for approximately 10 minutes.

EXAMPLES

Example 1

Three different device structures similar to that depicted in FIG. 1 were fabricated to investigate the effect of compositional offsets in accordance with embodiments of the present invention on internal device efficiency. Device structure A lacked compositional offsets 200, 205 and thus lacked two-dimensional hole gases. Specifically, device structure A incorporated an $Al_xGa_{1-x}N$ electron-blocking layer having an Al content of 85%, and the overlying graded layer had an Al content of 85% at its interface with the electron-blocking layer. Device structure B incorporated a compositional offset 200 in accordance with embodiments of the present invention. Specifically, device structure B incorporated an $Al_xGa_{1-x}N$ electron-blocking layer having an Al content of 85%, and the overlying graded layer had an Al content of 75% at its interface with the electron-blocking layer. Device structure C incorporated a compositional offset between the electron-blocking layer and the overlying graded layer, but in the direction opposite that depicted in FIG. 2, i.e., an Al mole fraction at the initiation of the graded layer greater than that of the underlying layer. Specifically, device structure C incorporated an $Al_xGa_{1-x}N$ electron-blocking layer having an Al content of 85%, and the overlying graded layer had an Al content of 95% at its interface with the electron-blocking layer.

Light-emitting devices were fabricated from the three different device structures, and the compositional offset 200 in accordance with embodiments of the invention provided significant gains in device efficiency (e.g., average internal efficiency) when compared to device structure A—the average internal efficiency of device structure B was approximately 40%, a factor of two greater than the average internal efficiency of device structure A (which was approximately 20%). In contrast, the compositional offset in the opposite direction in device structure C resulted in a significant reduction in device performance, even compared to the device lacking any compositional offset, as the average internal efficiency was less than 5%. Internal efficiency as used in this example is a calculated estimation of the product of the internal quantum efficiency and injection efficiency using a predetermined and constant extraction efficiency and measured output powers before and after thinning the substrate. Specifically, the internal efficiency IE was calculated as:

$$IE = \frac{L}{e^{-\alpha t} \times 0.047 \times E_\lambda \times I}$$

where L is the output power, α is the absorption coefficient of the substrate, t is the thickness of the substrate, $E_\lambda$ is the bandgap of the peak light emission, and I is the input current. The constant 0.047 is the calculated fraction of light escaping through a smooth planar substrate using an index of refraction appropriate for AlN at the wavelength λ of the peak light emission (the value would increase for a substrate with a smaller index of refraction).

Example 2

An n-type AlGaN back-contact layer, an AlGaN multiple quantum well, an AlGaN graded layer in which the Al composition was continuously graded from 85% to 20% from the multiple quantum well toward a p-type GaN cap layer, and the p-type GaN cap layer (having a thickness of 10 nm) were deposited in series on an AlN substrate. Thus, at the interface between the graded layer and the cap layer there was a compositional offset in Al content of 20%. A portion of the layer structure was dry etched using a chlorine-based gas so that a portion of the n-type AlGaN back-contact layer was exposed. Then, an n-type electrode composed of an alloy of Ti, Al, Ni, and Au was disposed on the exposed n-type AlGaN back-contact layer. A contact electrode composed of an alloy of Ni and Au was disposed on a portion of the p-type GaN cap layer, and a reflection layer composed of Al was disposed on an exposed portion of the p-type GaN cap layer and on the contact electrode, thereby obtaining a light-emitting device in accordance with embodiments of the present invention. When a current was caused to flow between the n-type electrode and the contact electrode, light emission having a wavelength of 275 nm and a power of 3.2 mW was obtained with a current of 100 mA.

Example 3

An n-type AlGaN back-contact layer, an AlGaN multiple quantum well, an AlGaN graded layer in which the Al composition was continuously graded from 85% to 20% from the multiple quantum well toward a p-type GaN cap layer, and the p-type GaN cap layer (having a thickness of 10 nm) were deposited in series on an AlN substrate. Thus, at the interface between the graded layer and the cap layer there was a compositional offset in Al content of 20%. A portion of the layer structure was dry etched using a chlorine-based gas so that a portion of the n-type AlGaN back-contact layer was exposed. Then, an n-type electrode composed of an alloy of Ti, Al, Ni, and Au was disposed on the exposed n-type AlGaN back-contact layer. A contact electrode composed of an alloy of Ni and Au was disposed on a portion of the p-type GaN cap layer, thereby obtaining a light-emitting device in accordance with embodiments of the present invention. When a current was caused to flow between the n-type electrode and the contact electrode, light emission having a wavelength of 275 nm and a power of 2.7 mW was obtained with a current of 100 mA.

Comparative Example

An n-type AlGaN back-contact layer, an AlGaN multiple quantum well, an AlGaN graded layer in which the Al composition was continuously graded from 85% to 0% from the multiple quantum well toward a p-type GaN cap layer, and the p-type GaN cap layer (having a thickness of 10 nm) were deposited in series on an AlN substrate. Thus, at the interface between the graded layer and the cap layer there was no compositional offset in Al content. A portion of the layer structure was dry etched using a chlorine-based gas so that a portion of the n-type AlGaN back-contact layer was exposed. Then, an n-type electrode composed of an alloy of Ti, Al, Ni, and Au was disposed on the exposed n-type AlGaN back-contact layer. A contact electrode composed of an alloy of Ni and Au was disposed on a portion of the p-type GaN cap layer, thereby obtaining a light-emitting device. When a current was caused to flow between the n-type electrode and the contact electrode, light emission having a wavelength of 275 nm and a power of 2.0 mW was obtained with a current of 100 mA. The lower emission power exhibited by this device compared with that of Examples 2 and 3 demonstrates one benefit of devices in accordance with embodiments of the present invention.

It is noted that the Examples provided herein were designed merely to compare device structures in order to demonstrate the efficacy of various embodiments of the present invention, and do not represent devices further optimized to produce state-of-the-art output power. For example, the structure described in Example 3 has been utilized in devices in which the AlN substrate was thinned to 200 microns after fabrication to reduce substrate absorption and which were packaged in a standard surface mounted design (SMD) package with good thermal conductivity (~10 K/W). Device output powers greater than 38 mW were obtained when operated at an input current of 400 mA with a peak wavelength of approximately 270 nm. Even greater powers would be anticipated with the addition of the reflection layer described in Example 2.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An ultraviolet (UV) light-emitting device comprising:
a substrate having an $Al_uGa_{1-u}N$ top surface, wherein $0 \leq u \leq 1.0$;
an active, light-emitting device structure disposed over the substrate, the light-emitting device structure comprising a multiple-quantum well layer comprising a plurality of periods each comprising a strained $Al_xGa_{1-x}N$ barrier and a strained $Al_yGa_{1-y}N$ quantum well, x and y being different by an amount facilitating confinement of charge carriers in the multiple-quantum well layer;
an electron blocking layer disposed over the multiple-quantum well layer, the electron blocking layer comprising $Al_vGa_{1-v}N$, wherein v>y and v>x;
a graded $Al_zGa_{1-z}N$ layer disposed over the electron blocking layer, a composition of the graded $Al_zGa_{1-z}N$ layer being graded in Al concentration z such that the Al concentration z decreases in a direction away from the light-emitting device structure;
a p-doped $Al_wGa_{1-w}N$ cap layer disposed over the graded $Al_zGa_{1-z}N$ layer, wherein $0 \leq w \leq 0.4$; and
a metallic contact disposed over the p-doped $Al_wGa_{1-w}N$ cap layer and comprising at least one metal,
wherein at an interface between the graded $Al_zGa_{1-z}N$ layer and the electron blocking layer, the Al concentration z of the graded $Al_zGa_{1-z}N$ layer is less than the Al concentration v of the electron blocking layer.

2. The device of claim 1, wherein, at the interface between the graded $Al_zGa_{1-z}N$ layer and the electron blocking layer, the Al concentration z of the graded $Al_zGa_{1-z}N$ layer is less than the Al concentration v of the electron blocking layer by an amount no less than 0.03.

3. The device of claim 1, wherein, at the interface between the graded $Al_zGa_{1-z}N$ layer and the electron blocking layer, the Al concentration z of the graded $Al_zGa_{1-z}N$ layer is less than the Al concentration v of the electron blocking layer by an amount no more than 0.85.

4. The device of claim 1, wherein, at the interface between the graded $Al_zGa_{1-z}N$ layer and the electron blocking layer, the Al concentration z of the graded $Al_zGa_{1-z}N$ layer is less than the Al concentration v of the electron blocking layer by an amount no less than 0.03 and by an amount no more than 0.85.

5. The device of claim 1, wherein $0.4 \leq u \leq 1.0$.

6. The device of claim 1, wherein $0 \leq w \leq 0.2$.

7. The device of claim 1, wherein the graded $Al_zGa_{1-z}N$ layer is undoped.

8. The device of claim 1, wherein a p-type dopant concentration within the graded $Al_zGa_{1-z}N$ layer is less than $10^{13}$ cm$^{-3}$.

9. The device of claim 1, wherein the Al concentration z of the graded $Al_zGa_{1-z}N$ layer at an interface between the graded $Al_zGa_{1-z}N$ layer and the p-doped $Al_wGa_{1-w}N$ cap layer is approximately equal to the Al concentration w of the p-doped $Al_wGa_{1-w}N$ cap layer.

10. The device of claim 1, wherein the Al concentration w of the p-doped $Al_wGa_{1-w}N$ cap layer is approximately 0.

11. The device of claim 1, wherein the substrate comprises doped or undoped AlN.

12. The device of claim 1, wherein the UV light-emitting device comprises a light-emitting diode.

13. The device of claim 1, wherein the UV light-emitting device comprises a laser.

14. The device of claim 1, wherein a thickness of the p-doped $Al_wGa_{1-w}N$ cap layer is no less than 1 nm and no greater than 50 nm.

15. The device of claim 1, further comprising an n-doped $Al_nGa_{1-n}N$ bottom contact layer disposed between the substrate and the multiple-quantum well layer, wherein y<n<x.

16. The device of claim 1, further comprising a reflection layer disposed over at least a portion of the p-doped $Al_wGa_{1-w}N$ cap layer, the reflection layer having a reflectivity to light emitted by the light-emitting device structure larger than a reflectivity to light emitted by the light-emitting device structure of the metallic contact.

17. The device of claim 16, wherein the reflection layer comprises Al.

18. The device of claim 16, further comprising a transmissive layer disposed between at least a portion of the reflection layer and the p-doped $Al_wGa_{1-w}N$ cap layer, the transmissive layer having a transmissivity to light emitted by the light-emitting structure larger than a transmissivity to light emitted by the light-emitting structure of the metallic contact.

19. The device of claim 18, wherein the transmissive layer comprises at least one of silicon oxide, silicon nitride, aluminum oxide, or gallium oxide.

20. An ultraviolet (UV) light-emitting device comprising:
a substrate having an $Al_uGa_{1-u}N$ top surface, wherein $0 \leq u \leq 1.0$;
an active, light-emitting device structure disposed over the substrate, the light-emitting device structure comprising a multiple-quantum well layer comprising a plurality of periods each comprising a strained $Al_xGa_{1-x}N$ barrier and a strained $Al_yGa_{1-y}N$ quantum well, x and y being different by an amount facilitating confinement of charge carriers in the multiple-quantum well layer;

a graded $Al_zGa_{1-z}N$ layer disposed over the multiple-quantum well layer, a composition of the graded $Al_zGa_{1-z}N$ layer being graded in Al concentration z such that the Al concentration z decreases in a direction away from the light-emitting device structure;

a p-doped $Al_wGa_{1-w}N$ cap layer disposed over the graded $Al_zGa_{1-z}N$ layer, wherein $0 \leq w \leq 0.4$; and a metallic contact disposed over the p-doped $Al_wGa_{1-w}N$ cap layer and comprising at least one metal, wherein at an interface between the graded $Al_zGa_{1-z}N$ layer and the p-doped $Al_wGa_{1-w}N$ cap layer, the Al concentration w of the p-doped $Al_wGa_{1-w}N$ cap layer is less than the Al concentration z of the graded $Al_zGa_{1-z}N$ layer.

21. The device of claim 20, wherein, at the interface between the graded $Al_zGa_{1-z}N$ layer and the p-doped $Al_wGa_{1-w}N$ cap layer, the Al concentration w of the p-doped $Al_wGa_{1-w}N$ cap layer is less than the Al concentration z of the graded $Al_zGa_{1-z}N$ layer by an amount no less than 0.03.

22. The device of claim 20, wherein, at the interface between the graded $Al_zGa_{1-z}N$ layer and the p-doped $Al_wGa_{1-w}N$ cap layer, the Al concentration w of the p-doped $Al_wGa_{1-w}N$ cap layer is less than the Al concentration z of the graded $Al_zGa_{1-z}N$ layer by an amount no more than 0.85.

23. The device of claim 20, wherein, at the interface between the graded $Al_zGa_{1-z}N$ layer and the p-doped $Al_wGa_{1-w}N$ cap layer, the Al concentration w of the p-doped $Al_wGa_{1-w}N$ cap layer is less than the Al concentration z of the graded $Al_zGa_{1-z}N$ layer by an amount no less than 0.03 and by an amount no more than 0.85.

24. The device of claim 20, wherein $0.4 \leq u \leq 1.0$.

25. The device of claim 20, wherein $0 \leq w \leq 0.2$.

26. The device of claim 20, wherein the graded $Al_zGa_{1-z}N$ layer is undoped.

27. The device of claim 20, wherein a p-type dopant concentration within the graded $Al_zGa_{1-z}N$ layer is less than $10^{13}$ cm$^{-3}$.

28. The device of claim 20, further comprising, disposed between the multiple-quantum well layer and the graded $Al_zGa_{1-z}N$ layer, an electron blocking layer comprising $Al_vGa_{1-v}N$, wherein v>y and v>x.

29. The device of claim 28, wherein the Al concentration z of the graded $Al_zGa_{1-z}N$ layer at an interface between the graded $Al_zGa_{1-z}N$ layer and the electron blocking layer is approximately equal to the Al concentration v of the electron blocking layer.

30. The device of claim 20, wherein the Al concentration w of the p-doped $Al_wGa_{1-w}N$ cap layer is approximately 0.

31. The device of claim 20, wherein the substrate comprises doped or undoped AlN.

32. The device of claim 20, wherein the UV light-emitting device comprises a light-emitting diode.

33. The device of claim 20, wherein the UV light-emitting device comprises a laser.

34. The device of claim 20, wherein a thickness of the p-doped $Al_wGa_{1-w}N$ cap layer is no less than 1 nm and no greater than 50 nm.

35. The device of claim 20, further comprising an n-doped $Al_nGa_{1-n}N$ bottom contact layer disposed between the substrate and the multiple-quantum well layer, wherein y<n<x.

36. The device of claim 20, further comprising a reflection layer disposed over at least a portion of the p-doped $Al_wGa_{1-w}N$ cap layer, the reflection layer having a reflectivity to light emitted by the light-emitting device structure larger than a reflectivity to light emitted by the light-emitting device structure of the metallic contact.

37. The device of claim 36, wherein the reflection layer comprises Al.

38. The device of claim 36, further comprising a transmissive layer disposed between at least a portion of the reflection layer and the p-doped $Al_wGa_{1-w}N$ cap layer, the transmissive layer having a transmissivity to light emitted by the light-emitting structure larger than a transmissivity to light emitted by the light-emitting structure of the metallic contact.

39. The device of claim 38, wherein the transmissive layer comprises at least one of silicon oxide, silicon nitride, aluminum oxide, or gallium oxide.

* * * * *